United States Patent
Watanabe et al.

(10) Patent No.: US 11,839,014 B2
(45) Date of Patent: Dec. 5, 2023

(54) ACTIVE GAS GENERATING APPARATUS

(71) Applicant: Toshiba Mitsubishi-Electric Industrial Systems Corporation, Tokyo (JP)

(72) Inventors: Kensuke Watanabe, Tokyo (JP); Ren Arita, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 256 days.

(21) Appl. No.: 17/416,531

(22) PCT Filed: Nov. 27, 2019

(86) PCT No.: PCT/JP2019/046328
§ 371 (c)(1),
(2) Date: Jun. 21, 2021

(87) PCT Pub. No.: WO2021/106100
PCT Pub. Date: Jun. 3, 2021

(65) Prior Publication Data
US 2022/0046781 A1    Feb. 10, 2022

(51) Int. Cl.
*H05H 1/24* (2006.01)
(52) U.S. Cl.
CPC .................. *H05H 1/2406* (2013.01)
(58) Field of Classification Search
None
See application file for complete search history.

(56) References Cited

U.S. PATENT DOCUMENTS

| 8,361,276 | B2 | 1/2013 | Selwyn |
| 9,006,972 | B2 | 4/2015 | Hopwood |
| 9,288,886 | B2 | 3/2016 | Koo |
| 10,450,654 | B2 * | 10/2019 | Watanabe ............... C23C 16/50 |

(Continued)

FOREIGN PATENT DOCUMENTS

| CN | 106797698 A | 5/2017 |
| JP | 2004-211161 A | 7/2004 |

(Continued)

OTHER PUBLICATIONS

International Search Report and Written Opinion dated Feb. 10, 2020, received for PCT Application No. 3CT/JP2019/046328, Filed on Nov. 27, 2019, 8 pages including English Translation.

(Continued)

*Primary Examiner* — Srinivas Sathiraju
(74) *Attorney, Agent, or Firm* — XSENSUS LLP

(57) ABSTRACT

In the present invention, an electrode pair having a discharge space therein is constituted by a combination of a high-voltage application electrode unit and a ground potential electrode unit. The high-voltage application electrode unit has, as the main components, an electrode dielectric film and a metal electrode formed on the upper surface of the electrode dielectric film. An auxiliary conductive film is formed in an annular shape so as to surround the metal electrode without overlapping the metal electrode in plan view. A metal electrode pressing member: has an annular shape in plan view; is provided to contact part of the upper surface of the auxiliary conductive film; and is fixed to a metal base flange. A ground potential is applied to the base flange.

4 Claims, 8 Drawing Sheets

(56) References Cited

U.S. PATENT DOCUMENTS

| | | |
|---|---|---|
| 10,793,953 B2 | 10/2020 | Watanabe |
| 10,840,065 B2 * | 11/2020 | Watanabe .......... H01J 37/32568 |
| 10,879,085 B2 | 12/2020 | Tabata |
| 10,889,896 B2 * | 1/2021 | Nishimura .............. C23C 16/50 |
| 10,927,454 B2 | 2/2021 | Nishimura |
| 10,971,338 B2 | 4/2021 | Arita |
| 11,129,267 B2 * | 9/2021 | Watanabe .......... H01J 37/32348 |
| 11,239,059 B2 * | 2/2022 | Watanabe ............. C23C 16/455 |
| 11,466,366 B2 * | 10/2022 | Tabata .................... H01L 21/31 |
| 11,532,458 B2 * | 12/2022 | Arita ................. H01J 37/32541 |
| 2004/0094411 A1 | 5/2004 | Chistyakov |
| 2013/0240144 A1 | 9/2013 | Buchberger et al. |
| 2013/0260567 A1 | 10/2013 | Marakhtanov |
| 2017/0241021 A1 * | 8/2017 | Tabata .............. H01J 37/32036 |
| 2018/0200687 A1 * | 7/2018 | Tabata .................. C23C 16/455 |
| 2018/0223433 A1 * | 8/2018 | Watanabe .............. C23C 16/50 |
| 2019/0226091 A1 * | 7/2019 | Nishimura ........ H01J 37/32449 |
| 2020/0152424 A1 * | 5/2020 | Arita .................... H01J 37/3244 |
| 2020/0176223 A1 * | 6/2020 | Watanabe ........... H05H 1/2406 |
| 2020/0260565 A1 * | 8/2020 | Watanabe ......... H01J 37/32036 |
| 2020/0291515 A1 * | 9/2020 | Nishimura ........ H01J 37/32348 |
| 2020/0343078 A1 * | 10/2020 | Watanabe ......... H01J 37/32082 |
| 2021/0057192 A1 * | 2/2021 | Arita ................. H01J 37/32357 |
| 2021/0233748 A1 * | 7/2021 | Watanabe ............. C23C 16/452 |
| 2022/0007487 A1 * | 1/2022 | Watanabe ........... H05H 1/2406 |
| 2022/0046781 A1 * | 2/2022 | Watanabe ......... H01J 37/32541 |
| 2022/0059322 A1 * | 2/2022 | Arita ................. H01J 37/32449 |
| 2022/0174807 A1 * | 6/2022 | Arita ................. H01J 37/32559 |
| 2023/0013017 A1 * | 1/2023 | Arita ................. H01J 37/32449 |
| 2023/0025809 A1 * | 1/2023 | Arita ................. H01J 37/32348 |
| 2023/0034041 A1 * | 2/2023 | Watanabe ........... H01J 37/3244 |

FOREIGN PATENT DOCUMENTS

| | | |
|---|---|---|
| JP | 2006-506521 A | 2/2006 |
| JP | 2006-303075 A | 11/2006 |
| JP | 2007-141583 A | 6/2007 |
| JP | 2009-205896 A | 9/2009 |
| JP | 2013-225672 A | 10/2013 |
| JP | 6239483 B2 | 11/2017 |
| KR | 10-2016-0063297 A | 6/2016 |
| WO | 2015/019765 A1 | 2/2015 |
| WO | 2017/159838 A1 | 9/2017 |
| WO | 2019/229873 A1 | 12/2019 |

OTHER PUBLICATIONS

International Search Report and Written Opinion dated Aug. 21, 2018 for PCT/JP2018/020736 filed on May 30, 2018, 9 pages including English Translation of the International Search Report.
International Search Report and Written Opinion dated Jan. 28, 2020, received for PCT Application PCT/JP2019/044356, Filed on Nov. 12, 2019, 8 pages including English Translation.
Office Action dated Jun. 22, 2022, in corresponding Chinese patent Application No. 201880093516.1, 19 pages.
Office Action dated Nov. 7, 2022, in corresponding Chinese patent Application No. 201880093516.1, 14 pages.

* cited by examiner

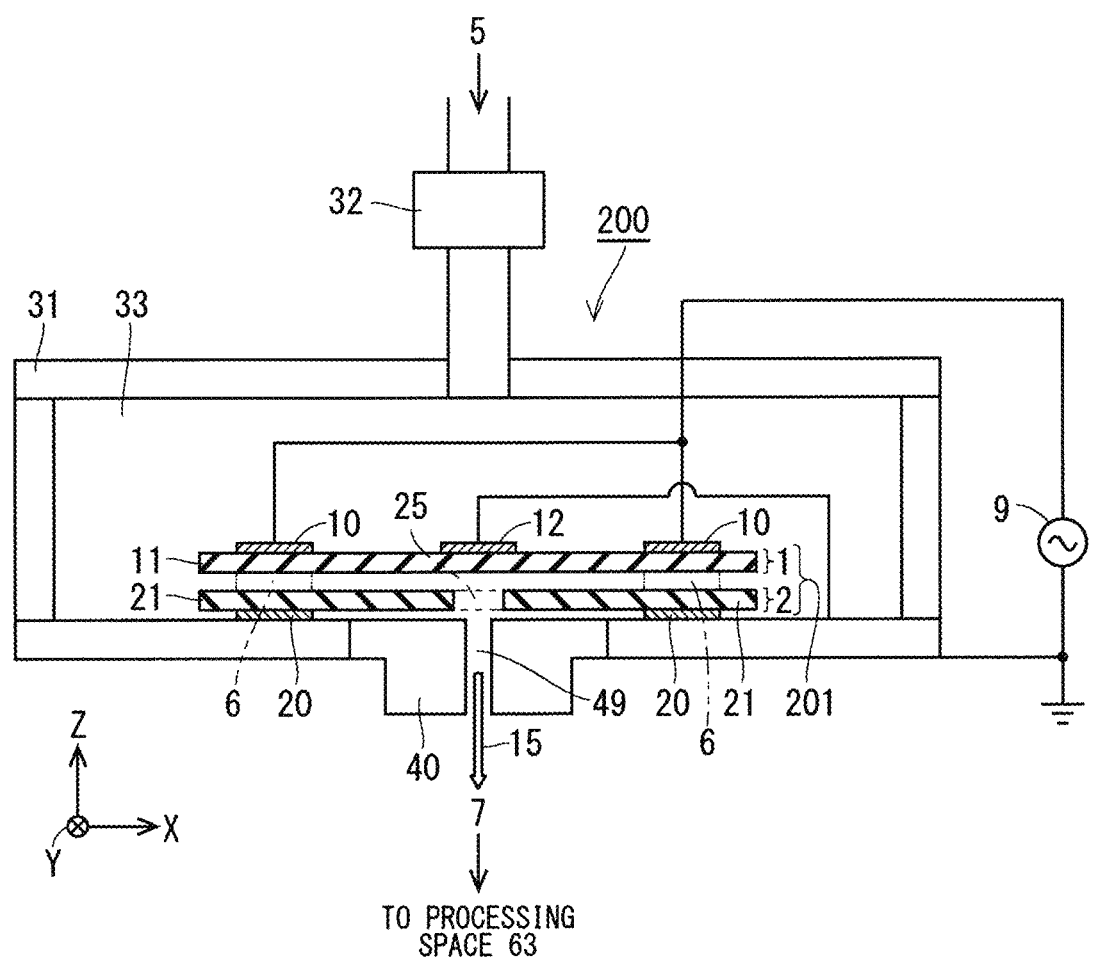
F I G. 1 3

ACTIVE GAS GENERATING APPARATUS

CROSS-REFERENCE TO RELATED APPLICATION

The present application is based on PCT filing PCT/JP2019/046328, filed Nov. 27, 2019, the entire contents of which is incorporated herein by reference.

TECHNICAL FIELD

The present invention relates to an active gas generating apparatus that generates an active gas by a parallel plate type dielectric barrier discharge and supplies the active gas to the subsequent processing space.

BACKGROUND ART

As an active gas generating apparatus that generates an active gas by a parallel plate type dielectric barrier discharge, for example, there is a nitrogen radical generation system disclosed in Patent Document 1.

In the conventional active gas generating apparatus disclosed in Patent Document 1, a processing chamber having a processing space is provided after the generating apparatus.

The nitrogen radical generation system, which is an active gas generating apparatus, generates nitrogen radicals that are an active gas from a nitrogen gas that is a raw material gas by using a dielectric barrier discharge, and ejects the active gases into the processing chamber.

PRIOR ART DOCUMENT

Patent Document

Patent Document 1: Japanese Patent Publication No. 6239483

SUMMARY

Problems to be Solved by the Invention

In the conventional active gas generating apparatus disclosed in Patent Document 1, it is assumed that the voltage applied to a first electrode and a second electrode facing each other may cause an abnormal discharge in the subsequent processing space.

That is, the voltage applied to generate a dielectric barrier discharge in the discharge space between the first electrode and the second electrode causes an area having an electric field strength, by which dielectric breakdown may be caused even in the processing room of the processing chamber that is a device after the active gas generating apparatus, so that an abnormal discharge, which is a discharge that may cause metal contamination, occurs in the processing chamber.

Since the processing room is under a more reduced pressure environment than the space of the active gas generating apparatus, there has been a problem that the ions generated by the abnormal discharge are accelerated by the electric field and collide with a wafer to be processed in the processing room, whereby the wafer may be damaged.

Also, in the active gas generating apparatus, there has been a possibility that if the electric field strength in an area leading to where the active gas reaches the processing room is high, an unintended discharge phenomenon may be caused in an area other than the discharge space, so that there has been a problem that the internal surface of the generating apparatus may be damaged, etc.

A purpose of the present invention is to provide an active gas generating apparatus that can: solve the above-described problems; and intentionally weaken an electric field strength in an area leading to where an active gas reaches the subsequent processing space.

Means to Solve the Problems

An active gas generating apparatus according to the present invention is an active gas generating apparatus that generates an active gas obtained by activating a raw material gas supplied to a discharge space, the active gas generating apparatus including: a first electrode component; and a second electrode component provided below the first electrode component, in which: the first electrode component has a first electrode dielectric film and a first metal electrode formed on an upper surface of the first electrode dielectric film, the second electrode component having a second electrode dielectric film and a second metal electrode formed on a lower surface of the second electrode dielectric film, an AC voltage being applied to the first metal electrode, the second metal electrode being set to a ground potential, and a dielectric space in which the first and second electrode dielectric films face each other including, as the discharge space, an area where the first and second metal electrodes overlap each other in plan view; the first electrode dielectric film has, at its center, a gas supply port for supplying the raw material gas to the discharge space; the gas supply port is provided not to overlap the first metal electrode in plan view; the second electrode dielectric film has at least one gas ejection hole for ejecting the active gas downward; the first electrode component further has an auxiliary conductive film formed, independently of the first metal electrode, on the upper surface of the first electrode dielectric film; the discharge space is formed to surround the gas supply port without overlapping the gas supply port in plan view; the at least one gas ejection hole is arranged such that a distance from the gas supply port is larger than a distance from the discharge space without overlapping the gas supply port and the discharge space in plan view, and in the dielectric space, a path from the discharge space to the at least one gas ejection hole is defined as an active gas flow path; the auxiliary conductive film surrounds the first metal electrode without overlapping the first metal electrode in plan view, and overlaps part of the active gas flow path in plan view; the active gas generating apparatus further includes an electrode auxiliary member that is provided to contact part of an upper surface of the auxiliary conductive film and that has conductivity; and the auxiliary conductive film is set to a ground potential via the electrode auxiliary member.

Effects of the Invention

In the active gas generating apparatus according to the present invention, the auxiliary conductive film set to the ground potential via the electrode auxiliary member is provided to overlap part of the active gas flow path in plan view.

Therefore, the active gas generating apparatus according to the present invention can relieve the electric field strength in the active gas flow path by the auxiliary conductive film set to the ground potential.

Additionally, in the active gas generating apparatus of the present invention, the auxiliary conductive film is formed to surround the first metal electrode without overlapping the first metal electrode in plan view.

Therefore, the auxiliary conductive film can be set to the ground potential via the electrode auxiliary member without straddling over the first metal electrode, so that the auxiliary conductive film to be set to the ground potential and the first metal electrode to be applied with an AC voltage can be relatively easily insulated and separated from each other.

As a result, the active gas generating apparatus according to the present invention has effects that: the electric field strength in the area leading to where the active gas reaches the processing space can be intentionally weakened; and the insulation between the first metal electrode and the auxiliary conductive film can be secured, with good stability, by a relatively simple configuration.

The purpose, characteristics, aspects and advantages of the present invention will become more apparent from the following detailed description and the accompanying drawings.

BRIEF DESCRIPTION OF DRAWINGS

FIG. 13 is an explanatory view illustrating a basic configuration of an active gas generating apparatus that is a base technology of the present invention.

DESCRIPTION OF EMBODIMENTS

Figure 1:
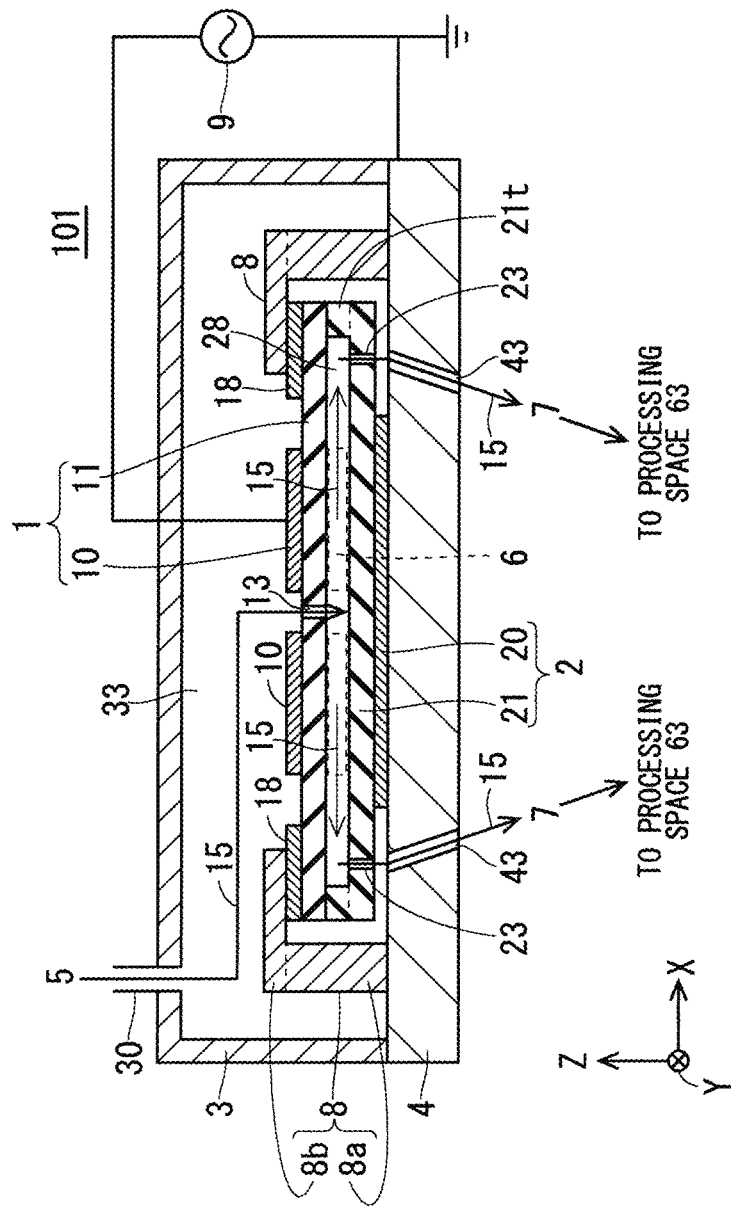
FIG. 1 is an explanatory view illustrating a basic configuration of an active gas generating apparatus according to a first embodiment of the present invention.

<Base Technology>
(Basic Configuration)

FIG. 13 is an explanatory view illustrating a basic configuration of an active gas generating apparatus that is a base technology of the present invention. FIG. 13 illustrates an XYZ orthogonal coordinate system. A gas generating apparatus 200 of the base technology is an active gas generating apparatus that generates an active gas 7 (nitrogen radical or the like) obtained by activating a raw material gas 5 (nitrogen gas or the like) supplied to a discharge space 6.

The gas generating apparatus 200 includes, as the main components, a metal housing 31, a gas supply port 32, an active gas generation electrode group 201, and an orifice part 40.

The metal housing 31 is a housing for the metal gas generating apparatus 200 set to a ground potential, and the gas supply port 32 is attached to an upper portion, so that the raw material gas 5 is supplied from the gas supply port 32 to an in-housing space 33 of the metal housing 31.

The active gas generation electrode group 201 is arranged in the in-housing space 33 of the metal housing 31 of the gas generating apparatus 200. Specifically, the active gas generation electrode group 201 is arranged on the bottom surface of the metal housing 31. The orifice part 40 is incorporated in part of the bottom surface of the metal housing 31.

The active gas generation electrode group 201 includes a combination of a high-voltage application electrode unit 1 that is a first electrode component and a ground potential electrode unit 2 that is a second electrode component, the ground potential electrode unit 2 being provided below the high-voltage application electrode unit 1.

The high-voltage application electrode unit 1 has, as the main components, an electrode dielectric film 11 that is a first electrode dielectric film, and a metal electrode 10 that is a first metal electrode formed on the upper surface of the electrode dielectric film 11. The high-voltage application electrode unit 1 further has a metal auxiliary conductive film 12 that is formed, independently of the metal electrode 10, on the upper surface of the electrode dielectric film 11 and that has conductivity.

The auxiliary conductive film 12 is provided between at least one gas ejection hole 25 and the metal electrode 10 made of metal in plan view. The metal auxiliary conductive film 12 may overlap the at least one gas ejection hole 25 in plan view.

The metal electrode 10 and the auxiliary conductive film 12 are provided on the upper surface of the electrode dielectric film 11 by using, for example, a sputtering method or a printing-firing method.

The ground potential electrode unit 2 has, as the main components, an electrode dielectric film 21 that is a second electrode dielectric film and a metal electrode 20 that is a second metal electrode formed on the lower surface of the electrode dielectric film 21.

The metal electrode 20 is provided on the lower surface of the electrode dielectric film 21 by using a sputtering method, a printing-firing method, or the like.

The electrode dielectric film 11 of the high-voltage application electrode unit 1 and the electrode dielectric film 21 of the ground potential electrode unit 2 are installed such that a predetermined constant interval is created by a non-illustrated spacer or the like.

And, an AC voltage is applied between the metal electrode 10 and the metal electrode 20 from a high-frequency power supply 9. Specifically, an AC voltage is applied to the metal electrode 10 from the high-frequency power supply 9, and the metal electrode 20 and the auxiliary conductive film 12 are set to the ground potential via the metal housing 31 to which the ground potential is applied.

In the dielectric space in which the electrode dielectric film 11 and the electrode dielectric film 21 face each other, the discharge space 6 is provided to include an area where the metal electrodes 10 and 20 overlap each other in plan view.

The upper surface of the electrode dielectric film 11 and the lower surface of the electrode dielectric film 21 may be flat, or may have a predetermined shape. For example, in the upper surface of the electrode dielectric film 11, an uneven shape may be provided such that a creeping discharge does not occur between the metal electrode 10 and the auxiliary conductive film 12, the uneven shape being served as an obstacle to the occurrence.

The electrode dielectric film 21 has at least one gas ejection hole 25 for finally ejecting the active gas 7 to an external processing space 63.

The orifice part 40 is provided below the electrode dielectric film 21, and has at least one through hole 49 corresponding to the at least one gas ejection hole 25. The orifice part 40 is made of one of ceramic, glass, and sapphire.

In the gas generating apparatus 200 having such a configuration, a dielectric barrier discharge is generated in the discharge space 6 of the active gas generation electrode group 201 by applying an AC voltage between the metal electrodes 10 and 20 from the high-frequency power supply 9. At the same time, the raw material gas 5 is supplied from the gas supply port 32 into the in-housing space 33 of the metal housing 31, whereby the raw material gas 5 is made flow from the outer periphery to the inside of the active gas generation electrode group 201.

In the gas generating apparatus 200, the active gas 7 is then generated by activating the raw material gas 5 in the discharge space 6, and the generated active gas 7 flows through an active gas flow path that is a path leading to the at least one gas ejection holes 25 from the discharge space 6 in the dielectric space.

The active gas 7 flowing through the active gas flow path passes through the at least one gas ejection hole 25 and the through hole 49 of the orifice part 40, and is finally supplied to the subsequent processing space 63 along a gas flow 15.

In the gas generating apparatus 200 of the base technology, the auxiliary conductive film 12 is provided to overlap part of the active gas flow path in plan view, as described above.

(Effects of Base Technology)

As described above, the gas generating apparatus 200 of the base technology has the following characteristics (1) and (2).

(1) The auxiliary conductive film 12 is provided to overlap part of the active gas flow path in plan view.

(2) The auxiliary conductive film 12 is set to the ground potential.

Since the gas generating apparatus 200 of the present embodiment has the above characteristics (1) and (2), the electric field strength in the active gas flow path can be relieved by the auxiliary conductive film 12 that is an auxiliary conductive film set to the ground potential.

As a result, the gas generating apparatus 200 of the present embodiment has the effect that the electric field strength in the processing space 63 provided below the active gas flow path and the orifice part 40 can be intentionally weakened without changing the structure of the orifice part 40.

(Problems of Base Technology)

In the high-voltage application electrode unit 1 of the base technology, the metal electrode 10 to which a high voltage is to be applied and the auxiliary conductive film 12 that is to be grounded are formed independently of each other. When the gas ejection hole 25 is provided at the center in plan view, however, the auxiliary conductive film 12 is arranged inside the metal electrode 10 in plan view.

As a first setting method for setting the auxiliary conductive film 12 to the ground potential, a method can be considered in which the auxiliary conductive film 12 is electrically connected to the bottom surface or the side surface of the metal housing 31 by using a conductive connecting member.

In the case of the first setting method, it is necessary to provide the connecting member inside the in-housing space 33, and hence the connecting member needs to straddle the metal electrode 10, but at this time, the connecting member and the metal electrode 10 must be reliably insulated from each other, as a matter of course.

However, it is not preferable to cover the periphery of the conductive connecting member with an insulating member made of any of various materials. This is because: if an insulating member covering the connecting member evaporates, the insulating member that has evaporated flows into the discharge space 6 and the processing space 63 as it is.

Therefore, in order to secure reliable insulation between the connecting member and the metal electrode 10, it is necessary to straddle the connecting member in the air at a considerable distance from the metal electrode 10 in the in-housing space 33, and it is necessary to widen the in-housing space 33 by that much, which may cause an increase in the size of the gas generating apparatus 200.

As a second setting method for setting to the ground potential, there is a method in which the upper surface of the metal housing 31 is electrically connected to the auxiliary conductive film 12 by using a conductive connecting member. When the second grounding method is adopted, an aspect (aspect A) in which when the lid of the metal housing 31 is closed, the connecting member is pressed by an elastic member such as a spring, or an aspect (aspect B) in which the connection is achieved by using an existing introduction terminal serving as the connecting member with a through hole provided in the lid of the metal housing 31, can be considered.

If either the aspect A or the aspect B is adopted as the second setting method, however, there has been a problem that the connecting member and its peripheral structure are inevitably complicated (using the elastic member, providing a hole in the upper surface of the metal housing 31, using a dedicated introduction member as the connecting member, or the like).

Purposes of a first embodiment and a second embodiment described below are to obtain an active gas generating apparatus that can: solve the above-described problems of the base technology; intentionally weaken the electric field strength in an area leading to where an active gas reaches the subsequent processing space; and the insulation between the first metal electrode and the auxiliary conductive film can be secured, with good stability, by a relatively simple configuration.

First Embodiment (Basic Configuration)

FIG. 1 is an explanatory view illustrating a basic configuration of an active gas generating apparatus according to a first embodiment of the present invention. FIG. 1 illustrates an XYZ orthogonal coordinate system. An active gas generating apparatus 101 of the first embodiment is an active gas generating apparatus that generates an active gas 7

(nitrogen radical or the like) obtained by activating a raw material gas 5 (nitrogen gas or the like) supplied to a discharge space 6.

The active gas generating apparatus 101 includes, as the main components, a metal housing 3, a base flange 4, a high-voltage application electrode unit 1 (including an auxiliary conductive film 18), a ground potential electrode unit 2, and an electrode pressing member 8.

The metal housing 3 is a housing made of metal that is set to the ground potential and has an opening below. The metal housing 3 is fixed to the base flange 4 in a way in which the metal base flange 4 becomes the bottom surface. Therefore, the opening of the metal housing 3 is shielded by the base flange 4, and an in-housing space 33 is formed by the metal housing 3 and the base flange 4.

A gas supply port 30 is attached near the upper end of the metal housing 3, so that the raw material gas 5 is supplied from the gas supply port 30 to the in-housing space 33.

A laminated structure of the high-voltage application electrode unit 1 and the ground potential electrode unit 2 is arranged in the in-housing space 33 of the active gas generating apparatus 101. Specifically, the ground potential electrode unit 2 is arranged on the upper surface of the base flange 4 in a way in which a metal electrode 20 contacts the upper surface of the base flange 4.

That is, the conductive base flange 4 supports the ground potential electrode unit 2 by contacting the metal electrode 20.

An electrode pair having the discharge space 6 therein is formed by a combination of the high-voltage application electrode unit 1 that is a first electrode component and the ground potential electrode unit 2 that is a second electrode component, the ground potential electrode unit 2 being provided below the high-voltage application electrode unit 1.

The high-voltage application electrode unit 1 has, as the main components, an electrode dielectric film 11 that is a first electrode dielectric film, and a metal electrode 10 that is a first metal electrode formed on the upper surface of the electrode dielectric film 11. The high-voltage application electrode unit 1 further has the auxiliary conductive film 18 that is made of metal and has conductivity, and that is formed, independently of the metal electrode 10, on the upper surface of the electrode dielectric film 11.

The metal electrode 10 and the auxiliary conductive film 18 are provided on the upper surface of the electrode dielectric film 11 by using, for example, a sputtering method or a printing-firing method.

The ground potential electrode unit 2 has, as the main components, an electrode dielectric film 21 that is a second electrode dielectric film and a metal electrode 20 that is a second metal electrode formed on the lower surface of the electrode dielectric film 21.

The metal electrode 20 is provided on the lower surface of the electrode dielectric film 21 by using a sputtering method, a printing-firing method, or the like.

And, an AC voltage is applied between the metal electrode 10 and the metal electrode 20 from a high-frequency power supply 9. Specifically, an AC voltage is applied to the metal electrode 10 from the high-frequency power supply 9, and the metal electrode 20 is set to the ground potential via the base flange 4.

In a closed space 28 that serves as a dielectric space in which the electrode dielectric film 11 and the electrode dielectric film 21 face each other, the discharge space 6 is provided to include an area where the metal electrodes 10 and 20 overlap each other in plan view.

The upper surface of the electrode dielectric film 11 and the lower surface of the electrode dielectric film 21 may be flat, or may have a predetermined shape. For example, in the upper surface of the electrode dielectric film 11, an uneven shape may be provided such that a creeping discharge does not occur between the metal electrode 10 and the auxiliary conductive film 18, the uneven shape serving as an obstacle to the occurrence.

The electrode dielectric film 21 has a plurality of gas ejection holes 23 (at least one gas ejection hole) for ejecting the active gas 7 to the lower (subsequent) processing space 63 via a gas ejection hole 43 of the base flange 4.

Part of the base flange 4 is located below the electrode dielectric film 21 without the metal electrode 20 interposed therebetween, and has a plurality of the gas ejection holes 43 (at least one base flange gas ejection hole) corresponding to the plurality of the gas ejection holes 23.

(High-Voltage Application Electrode Unit 1)

Figure 2:
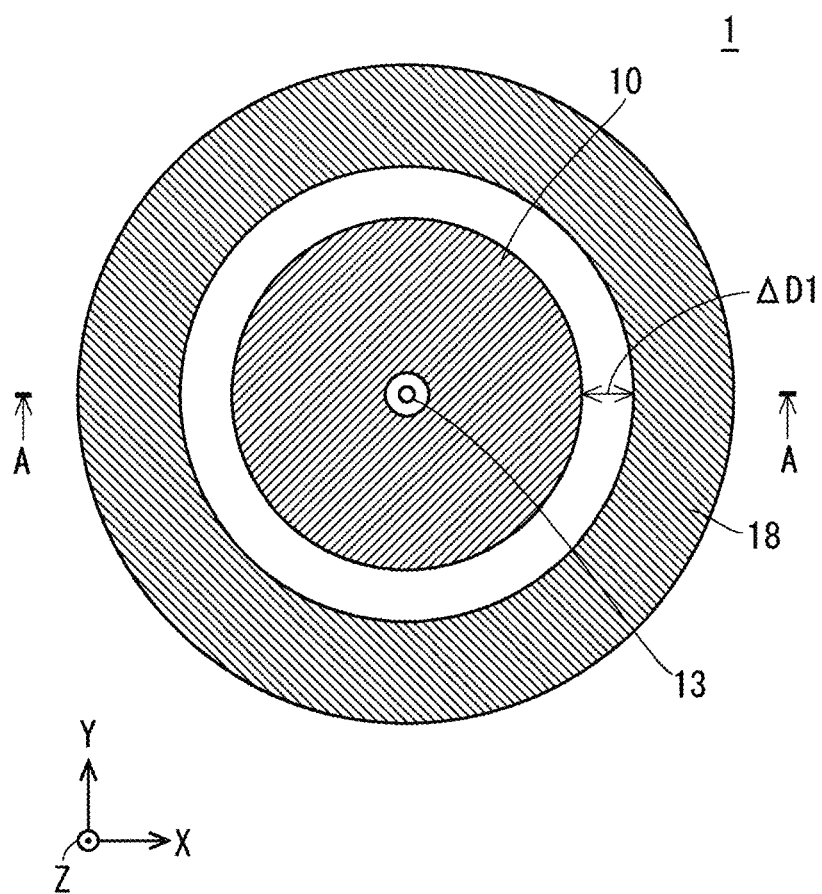
FIG. 2 is a plan view illustrating a configuration of the upper surface of the high-voltage application electrode unit illustrated in FIG. 1.
Figure 3:
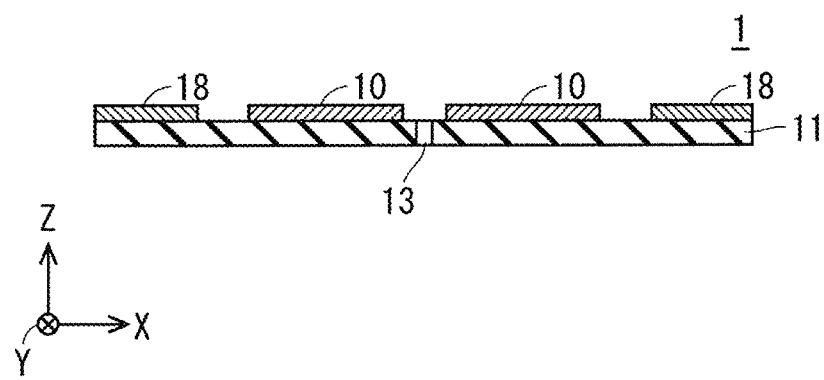
FIG. 3 is a cross-sectional view illustrating a structure of the cross section of the high-voltage application electrode unit illustrated in FIG. 1.

FIG. 2 is a plan view illustrating a configuration of the upper surface of the high-voltage application electrode unit 1 illustrated in FIG. 1, and FIG. 3 is a cross-sectional view illustrating a structure of the cross section of the high-voltage application electrode unit 1. FIG. 3 is a cross-sectional view taken along the line AA in FIG. 2 Each of FIGS. 2 and 3 illustrates an XYZ orthogonal coordinate system.

As illustrated in FIGS. 1 to 3, the electrode dielectric film 11 of the high-voltage application electrode unit 1 has a circular shape in plan view, and has, at its center, a gas supply port 13 for supplying the raw material gas 5 in the in-housing space 33 to the discharge space 6. The gas supply port 13 is formed to penetrate the electrode dielectric film 11.

The metal electrode 10 is formed in an annular shape so as to surround the gas supply port 13 without overlapping the gas supply port 13 in plan view.

The auxiliary conductive film 18 is formed in an annular shape so as to surround the metal electrode 10 along the outer periphery of the electrode dielectric film 11 without overlapping the metal electrode 10 in plan view.

(Ground Potential Electrode Unit 2)

Figure 4:
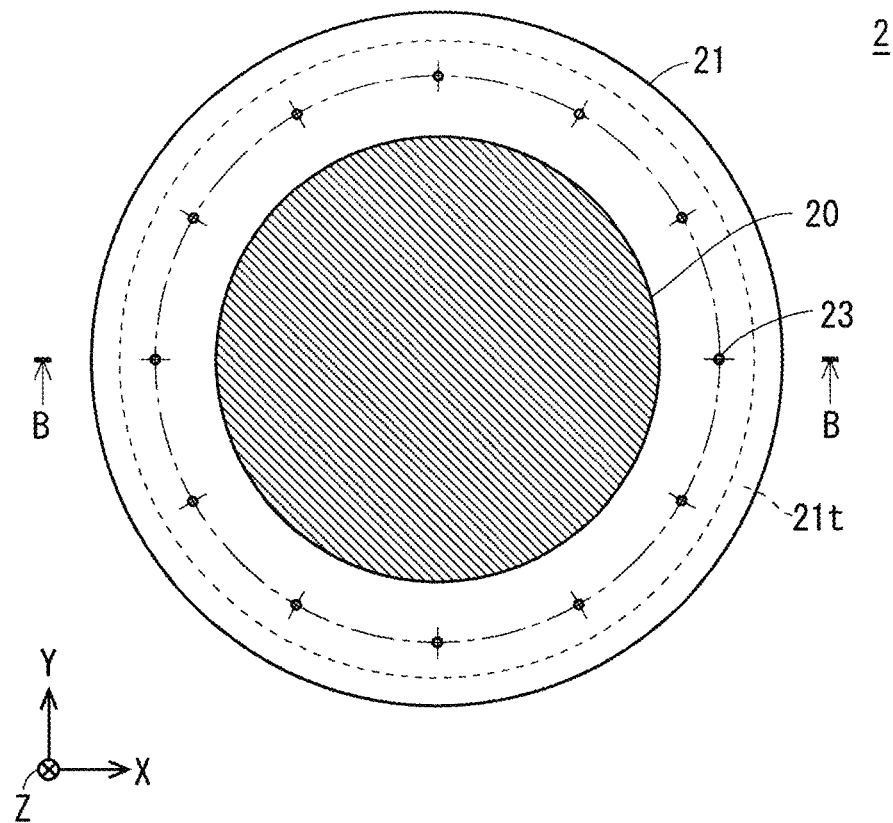
FIG. 4 is a plan view illustrating a configuration of the lower surface of the ground potential electrode unit illustrated in FIG. 1.
Figure 5:
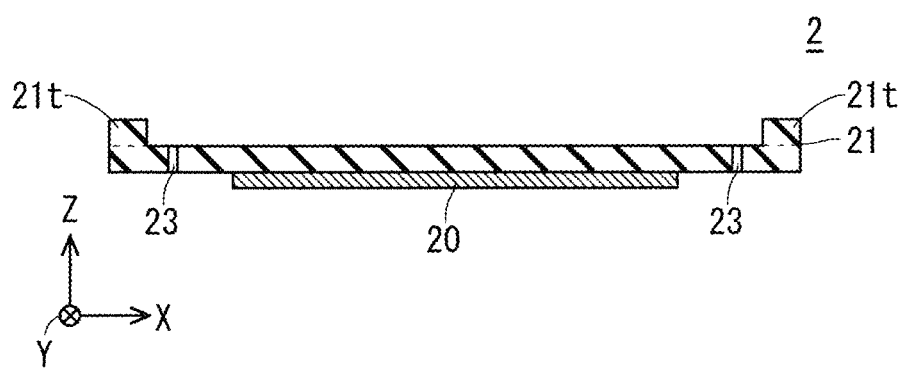
FIG. 5 is a cross-sectional view illustrating a structure of the cross section of the ground potential electrode unit illustrated in FIG. 1.

FIG. 4 is a plan view illustrating a configuration of the lower surface of the ground potential electrode unit 2 illustrated in FIG. 1, and FIG. 5 is a cross-sectional view illustrating a structure of the cross section of the ground potential electrode unit 2. FIG. 5 is a cross-sectional view taken along the line BB in FIG. 4. Each of FIGS. 4 and 5 illustrates an XYZ orthogonal coordinate system.

As illustrated in FIGS. 1, 4, and 5, the metal electrode 20 of the ground potential electrode unit 2 is formed in a circular shape in plan view in the central area of the lower surface of the electrode dielectric film 21.

Since the metal electrode 20 is formed to include all of the metal electrode 10 in plan view, the discharge space 6 in which the metal electrode 20 and the metal electrode 10 overlap each other in plan view is substantially defined by the area where the metal electrode 10 is formed.

The electrode dielectric film 21 of the ground potential electrode unit 2 has a circular shape in plan view, and has the plurality of the gas ejection holes 23 (at least one gas ejection hole) for ejecting the active gas 7 generated in the discharge space 6 downward. Each of the plurality of the gas ejection holes 23 is formed to penetrate the electrode dielectric film 21.

As illustrated in FIG. 4, the plurality of the gas ejection holes 23 are discretely provided along the circumferential direction so as to surround the metal electrode 20 without overlapping the metal electrode 20 in plan view.

The electrode dielectric film 21 integrally has a protruding area 21*t* whose upper portion protrudes along the outer periphery in plan view.

Therefore, the electrode dielectric films 11 and 21 are laminated such that the lower surface of the electrode dielectric film 11 contacts the upper surface of the protruding area 21*t* of the electrode dielectric film 21, as illustrated in FIGS. 1 and 5. That is, the electrode dielectric films 11 and 21 are laminated by the surfaces of the lower surface of the electrode dielectric film 11 and the upper surface of the protruding area 21*t* contacting each other.

As a result, the closed space 28 is formed between the lower surface of the electrode dielectric film 11 and the upper surface of the electrode dielectric film 21, the closed space 28 being shielded from the outside (the in-housing space 33, the processing space 63, etc.) except for the gas supply port 13 and the plurality of the gas ejection holes 23.

At this time, the closed space 28 completely shielded from the outside can be formed by sealing the upper surface of the protruding area 21*t* and the lower surface of the electrode dielectric film 11 with, for example, a non-illustrated O-ring or the like. That is, the in-housing space 33 and the closed space 28 are connected together only via the gas supply port 13 for supplying to the discharge space 6.

Therefore, even if an abnormal discharge occurs in the in-housing space 33, the discharge space 6 located in the closed space 28 is not adversely affected.

The gap length of the discharge space 6 can be defined by the height of the protruding area 21*t* protruding from the upper surface of the electrode dielectric film 21.

Instead of forming the protruding area 21*t* integrally with the electrode dielectric film 21, the protruding area 21*t* may be formed as a component different from the electrode dielectric film 21.

This closed space 28 becomes the dielectric space in which the electrode dielectric films 11 and 21 face each other. The discharge space 6 is provided in the closed space 28, and the discharge space 6 becomes a space in the closed space 28, the space including the area where the metal electrodes 10 and 20 overlap each other in plan view.

Since the metal electrode 10 does not overlap the gas supply port 13 in plan view, the discharge space 6 is formed to surround the gas supply port 13 along the planar shape of the metal electrode 10 without overlapping the gas supply port 13 in plan view.

The plurality of the gas ejection holes 23 are arranged such that a distance from the gas supply port 13 is larger than a distance from the discharge space 6 without overlapping the gas supply port 13 and the discharge space 6 (metal electrode 10) in plan view, and the path from the discharge space 6 to each of the plurality of the gas ejection holes 23 in the closed space 28 is defined as an active gas flow path through which the active gas 7 flows.

Therefore, if the gas supply port 13 is provided at the center, the auxiliary conductive film 18 is located outside the discharge space 6 in plan view and inside the plurality of the gas ejection holes 23 in plan view. Therefore, the auxiliary conductive film 18 overlaps part of the active gas flow path in plan view. As illustrated in FIG. 1, it is desirable that part of the auxiliary conductive film 18 overlaps the plurality of the gas ejection holes 23 in plan view. This is because the electric field strength at the end of the active gas flow path can be reliably reduced.

Further, an orifice function can be provided to each of the plurality of the gas ejection holes 23 by setting the diameter of each of them to be sufficiently small. In the present description, the "orifice function" means, in areas before and after the gas passing portion (gas ejection hole 23), the function of lowering the pressure in the area after the gas passing portion from the pressure in the area before the gas passing portion.

(Base Flange 4)

Figure 6:
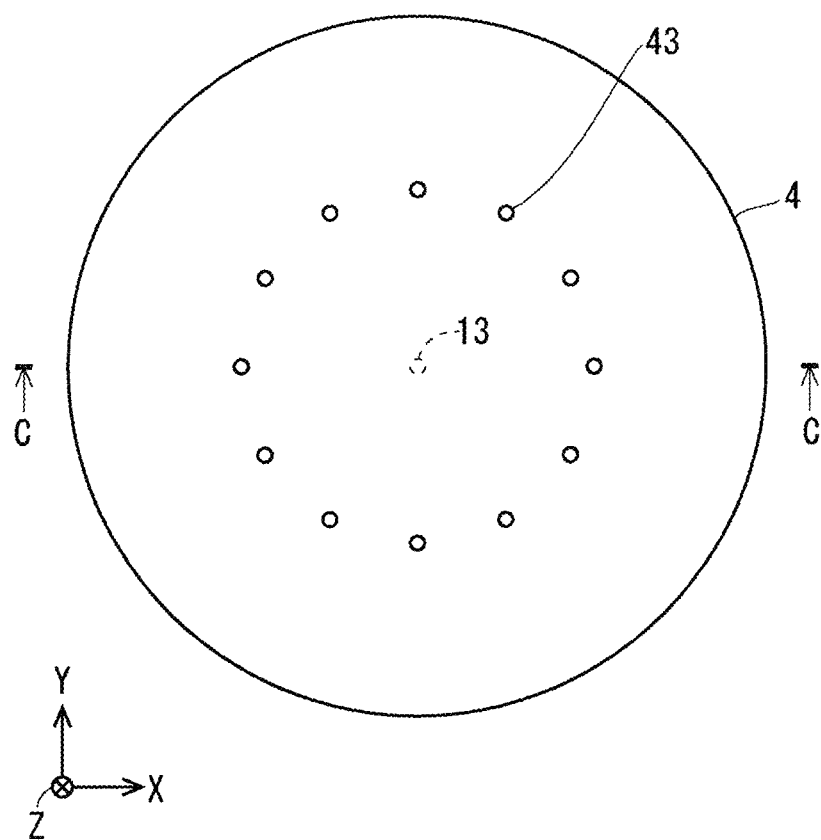
FIG. 6 is a plan view illustrating a configuration of the lower surface of the base flange illustrated in FIG. 1.
Figure 7:
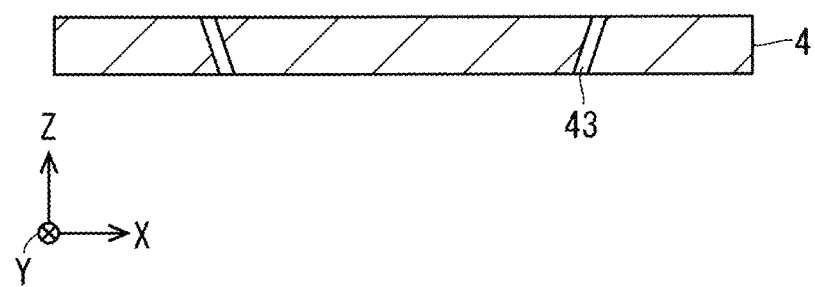
FIG. 7 is a cross-sectional view illustrating a structure of the cross section of the base flange illustrated in FIG. 1.

FIG. 6 is a plan view illustrating a configuration of the lower surface of the base flange 4 illustrated in FIG. 1, and FIG. 7 is a cross-sectional view illustrating a structure of the cross section of the base flange 4. FIG. 7 is a cross-sectional view taken along the line CC in FIG. 6. Each of FIGS. 6 and 7 illustrates an XYZ orthogonal coordinate system.

As illustrated in FIGS. 1, 6, and 7, the base flange 4 has a circular shape in plan view, and has the plurality of the gas ejection holes 43 (at least one base flange gas ejection hole). Each of the plurality of the gas ejection holes 43 penetrates the base flange 4. The ground potential is applied to the base flange 4 that is made of metal and has conductivity.

As illustrated in FIG. 6, the plurality of the gas ejection holes 43 are discretely provided along the circumferential direction so as to surround the gas supply port 13 in plan view.

The plurality of the gas ejection holes 43 of the base flange 4 correspond to the plurality of the gas ejection holes 23, and are formed, in its upper surface, at positions matching the plurality of gas ejection holes 23 in plan view. That is, the plurality of the gas ejection holes 43 are provided directly below the plurality of the gas ejection holes 23. Therefore, of the plurality of the gas ejection holes 23 and the plurality of the gas ejection holes 43, the gas ejection holes 43 are provided directly below the gas ejection holes 23 that correspond to each other.

The plurality of the gas ejection holes 43 are formed to be inclined in the direction of the center position (position where the gas supply port 13 is provided) from the upper surface to the lower surface of the base flange 4.

Therefore, the positions of the lower surface of the base flange 4, where the plurality of the gas ejection holes 43 are formed, are located, in plan view, inside the positions of the upper surface thereof where the plurality of the gas ejection holes 43 are formed.

An orifice function can be provided to each of the plurality of the gas ejection holes 43 by setting the diameter of each of them to be sufficiently small. In this case, the "orifice function" means, in areas before and after the plurality of the gas ejection holes 43 that are gas passing portions, the function of lowering the pressure in the area after the gas passing portion from the pressure in the area before the gas passing portion.

However, the active gas generated in the discharge space 6 has a longer life if the pressure is lower, and hence it is desirable to provide an orifice function to the plurality of the gas ejection holes 23 closer to the discharge space 6 than the plurality of the gas ejection holes 43.

(Electrode Pressing Member 8)

Figure 8:
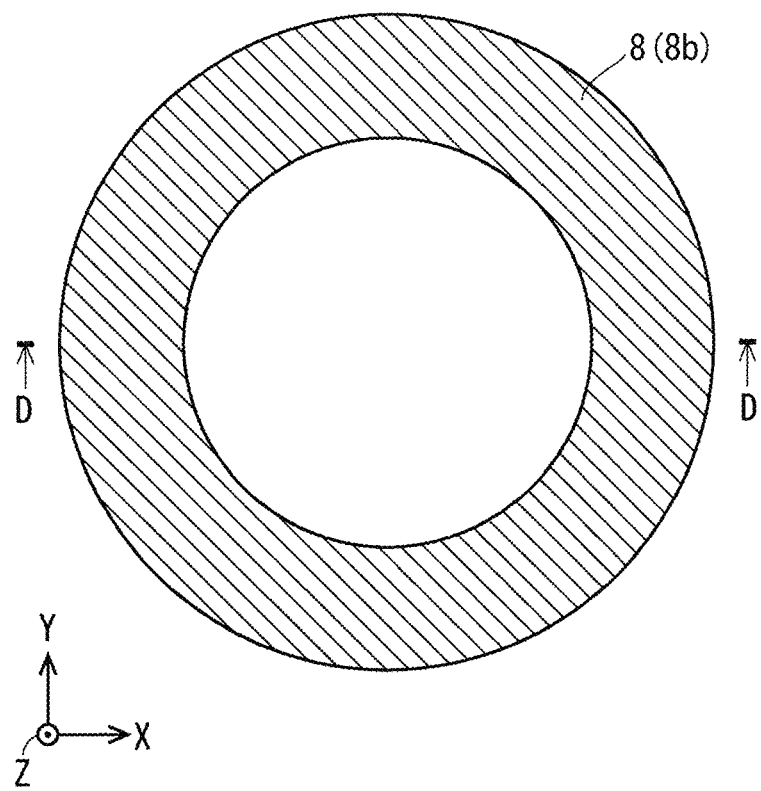
FIG. 8 is a plan view illustrating a configuration of the upper surface of the electrode pressing member illustrated in FIG. 1.
Figure 9:
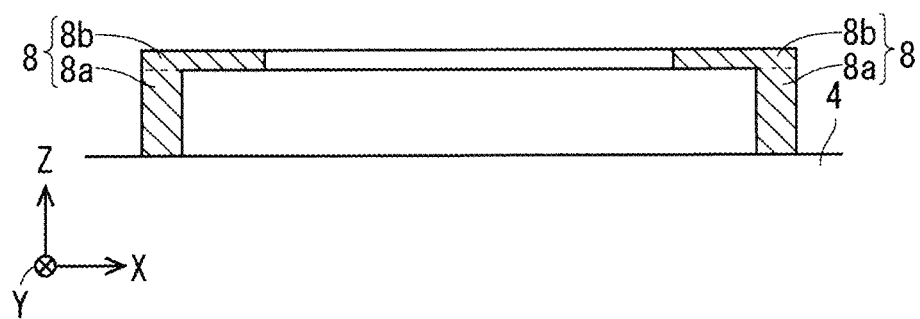
FIG. 9 is a cross-sectional view illustrating a structure of the cross section of the electrode pressing member illustrated in FIG. 1.

FIG. 8 is a plan view illustrating a configuration of the upper surface of the electrode pressing member 8 illustrated in FIG. 1, and FIG. 9 is a cross-sectional view illustrating a structure of the cross section of the electrode pressing member 8. FIG. 9 is a cross-sectional view taken along the line DD in FIG. 8 Each of FIGS. 8 and 9 illustrates an XYZ orthogonal coordinate system.

As illustrated in FIG. 1, the electrode pressing member 8 that is an electrode auxiliary member made of metal: is a member for pressing the auxiliary conductive film 18 from above; has an annular shape in plan view; and is provided in a way that contacts part of the upper surface of the auxiliary conductive film 18.

As illustrated in FIGS. 1 and 9, the electrode pressing member 8 includes a standing portion 8a and a pressing portion 8b that are integrated together. The standing portion 8a stands, on the upper surface of the base flange 4, along the outer peripheries of the electrode dielectric films 11 and 21 and at a small distance from the side surfaces of the electrode dielectric films 11 and 21. The pressing portion 8b is formed to extend in the horizontal direction (X direction) from the upper portion of the standing portion 8a toward the auxiliary conductive film 18.

As illustrated in FIG. 8, the pressing portion 8b of the electrode pressing member 8 is formed inward at a predetermined width along the outer periphery of the electrode dielectric film 11, in which the predetermined width is set to a value at which the electrode pressing member 8 contacts part of the upper surface of the auxiliary conductive film 18 and does not overlap the metal electrode 10 in plan view. In the first embodiment, the pressing portion 8b of the electrode pressing member 8 is provided away from the metal electrode 10 by a distance larger than an insulation distance ΔD1. Therefore, the electrode pressing member 8, the auxiliary conductive film 18, and the metal electrode 10 are electrically independent.

As illustrated in FIG. 1, the electrode pressing member 8 having conductivity is electrically connected to the base flange 4 by the standing portion 8a contacting the upper surface of the base flange 4, and the standing portion 8a is fixed onto the upper surface of the base flange 4.

As described above, the ground potential is applied to the base flange 4, and hence the auxiliary conductive film 18 can be relatively easily set to the ground potential via the base flange 4 and the electrode pressing member 8.

Since the electrode pressing member 8 is provided on the opposite side of the metal electrode 10 with respect to the auxiliary conductive film 18, the electrode pressing member 8 does not straddle over the metal electrode 10.

Further, the auxiliary conductive film 18 sufficiently secures the insulation distance ΔD1 from the metal electrode 10, and the electrode pressing member 8 is formed away by a distance larger than the insulation distance ΔD1; and hence it is not necessary to cover the auxiliary conductive film 18, the electrode pressing member 8, etc., with an insulating member.

(Operation)

In the active gas generating apparatus 101 having such a configuration, the raw material gas 5 supplied from the gas supply port 30 of the metal housing 3 into the in-housing space 33 is supplied into the closed space 28 only from the gas supply port 13 of the electrode dielectric film 11.

Then, the raw material gas 5 is activated in the discharge space 6 included in the closed space 28 that is the dielectric space, whereby the active gas 7 is obtained. The active gas 7 obtained in the discharge space 6 flows through the active gas flow path in the closed space 28 along the gas flow 15, and is then ejected from the plurality of the gas ejection holes 23 toward the lower base flange 4.

Then, the active gas 7 ejected downward from the plurality of the gas ejection holes 23 is supplied to the plurality of the gas ejection holes 43 of the base flange 4 provided to correspond to the plurality of the gas ejection holes 23. Further, the active gas 7 is supplied from the plurality of the gas ejection holes 43 to the lower processing space 63 along the gas flow 15. As described above, the processing space 63 is provided after the active gas generating apparatus 101.

Although a gap is illustrated between the plurality of the gas ejection holes 23 and the plurality of the gas ejection holes 43 in FIG. 1, the plurality of the gas ejection holes 23 and the plurality of the gas ejection holes 43 are actually sealed such that the active gas 7 flows only between the corresponding gas ejection holes 23 and 43.

Therefore, the active gas 7 generated in the discharge space 6 is only supplied from the gas ejection holes 43 of the base flange 4 to the lower processing space 63.

By also sealing the flow path for the active gas 7 between the ground potential electrode portion 2 and the base flange 4 with an O-ring or the like, as described above, the pressure in the space to which the metal electrode 10 for applying a high voltage and the metal electrode 20 set to the ground potential are exposed (the in-housing space 33 (including the space formed between the side surface of the end of the metal electrode 20 and the standing portion 8a of the electrode pressing member 8)) and the pressure in the discharge space 6 can be reliably separated from each other.

<Effects>

In the active gas generating apparatus 101 of the first embodiment, the auxiliary conductive film 18, set to the ground potential via the electrode pressing member 8 that is the electrode auxiliary member, is provided to overlap part of the active gas flow path in plan view.

Therefore, the active gas generating apparatus 101 can relieve the electric field strength in the active gas flow path by the auxiliary conductive film 18 set to the ground potential.

Additionally, in the active gas generating apparatus 101 of the first embodiment, the auxiliary conductive film 18 is formed to surround the metal electrode 10 (first metal electrode) without overlapping the metal electrode 10 in plan view.

Therefore, the auxiliary conductive film 18 can be set to the ground potential via the electrode pressing member 8 without straddling over the metal electrode 10, as illustrated in FIG. 1, whereby the auxiliary conductive film 18 that is to be set to the ground potential and the metal electrode 10 to which an AC voltage is to be applied can be relatively easily insulated and separated from each other.

As a result, the active gas generating apparatus 101 of the first embodiment has effects that: the electric field strength, existing in the area where the active gas 7 flows through the active gas flow path and the plurality of the gas ejection holes 43 to reach the processing space 63, can be intentionally weakened; and the insulation between the metal electrode 10 and the auxiliary conductive film 18 can be secured with good stability by a relatively simple configuration.

Additionally, the electric field strength in the processing space 63 provided below (after) the plurality of the gas ejection holes 23 can be intentionally weakened even if the base flange 4 is made of an insulator.

Further, the closed space 28 sealed from the outside is formed between the high-voltage application electrode unit 1 and the ground potential electrode unit 2 as the dielectric space. Therefore, by providing an orifice function with the diameter of the gas supply port 13 of the electrode dielectric film 11 set to be sufficiently small, a desired pressure difference can be created between the closed space 28 including the discharge space 6 and the in-housing space 33 that is a space outside the closed space 28. In this case, the "orifice function" means, in areas before and after the gas supply port 13 that is a gas passing portion, the function of lowering the pressure in the area after the gas passing portion from the pressure in the area before the gas passing portion.

As a result, the pressure in the closed space 28 including the discharge space 6 can be set to be relatively low even if the pressure in the in-housing space 33, which is a space to which the upper surface of the metal electrode 10 is mainly exposed, is made sufficiently high. Therefore, dielectric breakdown of gas in the in-housing space 33 can be effectively suppressed by sufficiently increasing the pressure in the in-housing space 33.

Therefore, the metal housing 3 can be formed to be small in size by forming the in-housing space 33 so as to be relatively narrow while keeping the effect of suppressing the dielectric breakdown, whereby the active gas generating apparatus 101 can be miniaturized.

In the active gas generating apparatus 101, the auxiliary conductive film 18 is pressed from above by the electrode pressing member 8 fixed to the base flange 4. Therefore, in the active gas generating apparatus 101, the high-voltage application electrode unit 1 and the ground potential electrode unit 2 can be fixed, with good stability, onto the base flange 4 by the electrode pressing member 8.

Specifically, the auxiliary conductive film 18 is formed near to the outer peripheral area of the metal electrode 10, and hence the auxiliary conductive film 18 can be pressed relatively easily by the electrode pressing member 8 provided near to the outer peripheral area of the electrode dielectric film 11. Additionally, as means for the fixation in a state in which the pressing portion 8b of the electrode pressing member 8 contacts part of the upper surface of the auxiliary conductive film 18, for example, screwing using a bolt, a nut, etc., can be considered. By screwing the pressing portion 8b of the electrode pressing member 8 fixed to the base flange 4 and part of the upper surface of the auxiliary conductive film 18, the auxiliary conductive film 18 can be pressed from above by the electrode pressing member 8.

Further, the ground potential is applied to the base flange 4, and hence the auxiliary conductive film 18 can be set to the ground potential via the base flange 4 and the electrode pressing member 8. Therefore, the auxiliary conductive film 18 can be set to the ground potential without providing a connecting member above the metal electrode 10. Therefore, the insulation between the auxiliary conductive film 18 and the metal electrode 10 can be secured by a relatively simple configuration.

Additionally, the metal electrode 20, which is the second metal electrode, can be relatively easily set to the ground potential via the base flange 4. Also, the base flange 4 is made of metal and has conductivity, and hence no electric field leaks into the lower processing space 63.

Furthermore, the active gas 7 can be ejected from the plurality of the gas ejection holes 43 (at least one base flange gas ejection hole) to the lower (subsequent) processing space 63, and hence the presence of the base flange 4 does not interfere with the function of ejecting the active gas 7.

Second Embodiment (Basic Configuration)

Figure 10:
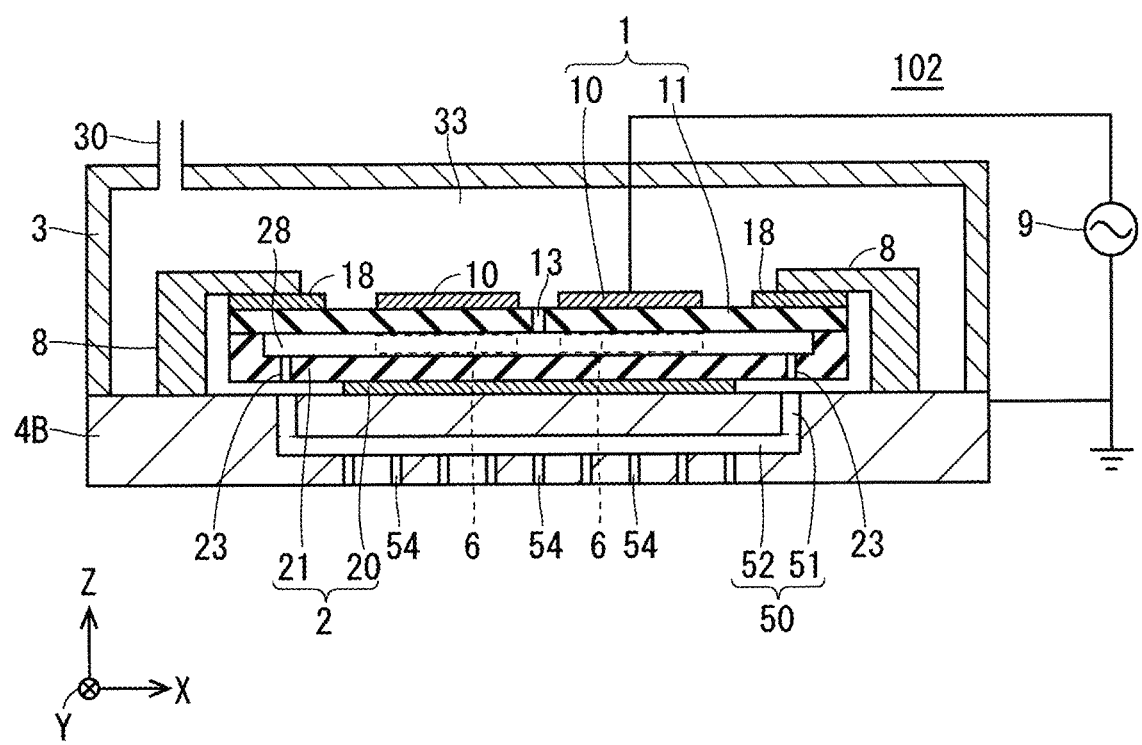
FIG. 10 is an explanatory view illustrating a basic configuration of an active gas generating apparatus according to a second embodiment of the present invention.

FIG. 10 is an explanatory view illustrating a basic configuration of an active gas generating apparatus according to a second embodiment of the present invention. FIG. 10 illustrates an XYZ orthogonal coordinate system. An active gas generating apparatus 102 of the second embodiment is an active gas generating apparatus that generates the active gas 7 obtained by activating the raw material gas 5 supplied to the discharge space 6, similarly to the active gas generating apparatus 101.

The active gas generating apparatus 102 of the second embodiment has the same structure as the active gas generating apparatus 101 of the first embodiment, except that the base flange 4 is replaced by a base flange 4B. Hereinafter, the same components as those of the first embodiment are denoted by the same reference signs, and the description will be appropriately omitted.

The active gas generating apparatus 102 includes, as the main components, the metal housing 3, the base flange 4B, the high-voltage application electrode unit 1 (including the auxiliary conductive film 18), the ground potential electrode unit 2, and the electrode pressing member 8.

(Base Flange 4B)

Figure 11:
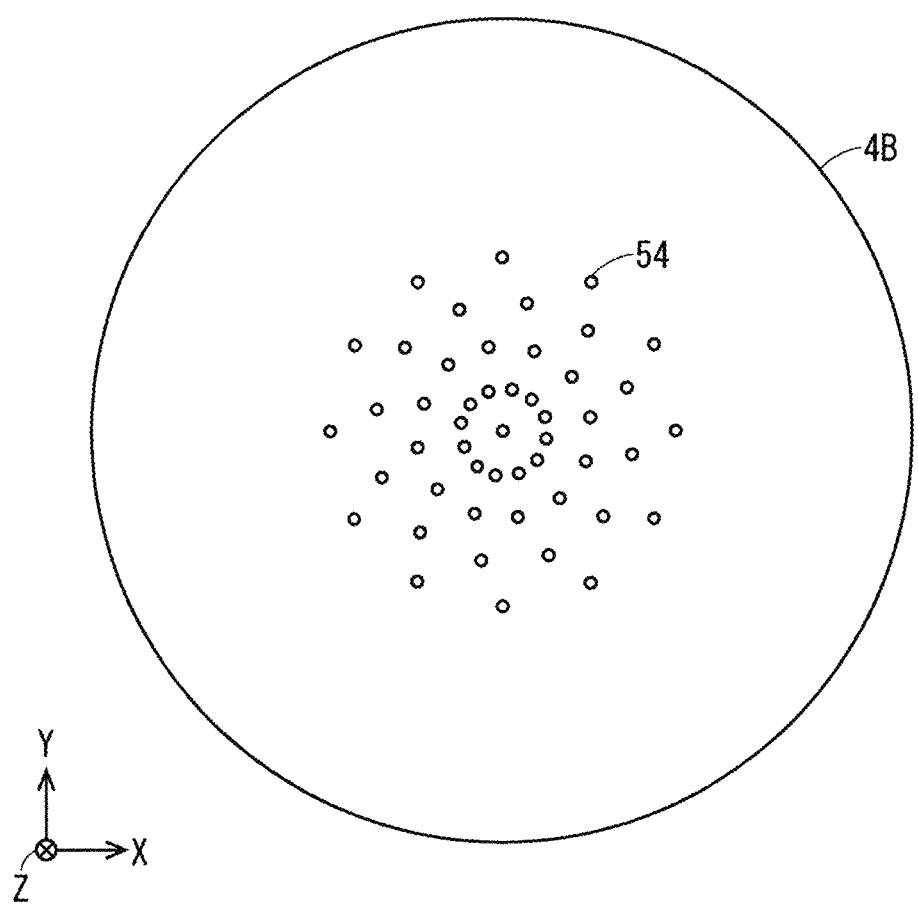
FIG. 11 is a plan view illustrating a configuration of the lower surface of the base flange illustrated in FIG. 10.
Figure 12:
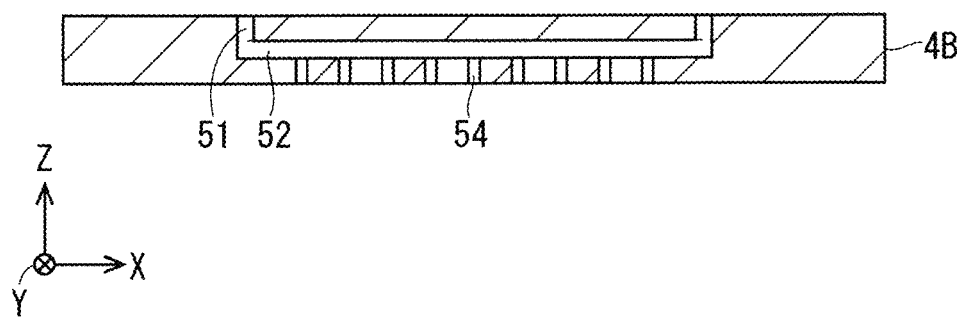
FIG. 12 is a cross-sectional view illustrating a structure of the cross section of the base flange illustrated in FIG. 10.

FIG. 11 is a plan view illustrating a configuration of the lower surface of the base flange 4B illustrate in FIG. 10, and FIG. 12 is a cross-sectional view illustrating a structure of the cross section of the base flange 4B. Each of FIGS. 11 and 12 illustrates an XYZ orthogonal coordinate system.

As illustrated in FIGS. 1, 11, and 12, the base flange 4B has a circular shape in plan view, and has a plurality of gas supply ports 51 in its upper surface and a plurality of gas ejection holes 54 (a plurality of base flange gas ejection holes) in its lower surface. The ground potential is applied to the base flange 4B.

In the upper surface of the base flange 4B, the plurality of the gas supply ports 51 are discretely provided along the circumferential direction so as to surround the gas supply port 13 in plan view, similarly to the plurality of the gas ejection holes 43 of the first embodiment 1 (see FIG. 6).

The plurality of the gas supply ports 51 of the base flange 4B correspond to the plurality of the gas ejection holes 23, and are formed, in the upper surface, at positions corresponding to the plurality of the gas ejection holes 23 in plan view. That is, the plurality of the gas supply ports 51 are provided directly below the plurality of the gas ejection holes 23. Therefore, of the plurality of the gas ejection holes 23 and the plurality of the gas supply ports 51, the gas supply ports 51 are provided directly below the gas ejection holes 23 that correspond to each other.

As illustrated in FIGS. 10 and 12, each of the plurality of the gas supply ports 51 is connected to an intermediate area 52 provided inside the base flange 4B, and each of the plurality of gas ejection holes 54 is connected to this intermediate area 52. The combined structure of the plurality of the gas supply ports 51 and the intermediate area 52 becomes a gas relay passage 50.

The intermediate area 52 is provided inside the base flange 4B so as to extend in the horizontal direction (X direction). Therefore, the active gas 7 supplied to the plurality of the gas supply ports 51 is finally ejected downward from the plurality of the gas ejection holes 54 via the intermediate area 52.

As illustrated in FIG. 11, the plurality of the gas ejection holes 54 are arranged in the lower surface of the base flange 4B and in a so-called shower plate shape in which they are radially separated and arranged in plan view.

An orifice function can be provided to each of the plurality of gas ejection holes 54 by setting the diameter of each of them to be sufficiently small. The active gas has a longer life if the pressure is lower, and hence it is desirable to provide an orifice function to the plurality of the gas ejection holes 23 closer to the discharge space 6 than the plurality of the gas ejection holes 54.

(Operation)

In the active gas generating apparatus 102 having such a configuration, the active gas 7 ejected downward from the plurality of the gas ejection holes 23 of the electrode dielectric film 21 is supplied to the plurality of the gas supply ports 51 of the base flange 4B provided to correspond to the plurality of the gas ejection holes 23, similarly to the active gas generating apparatus 101 of the first embodiment.

The active gas 7 is further supplied from the plurality of the gas supply ports 51 to the intermediate area 52, and then is supplied from the plurality of the gas ejection holes 54 to the lower processing space 63. As described above, the processing space 63 is provided after the active gas generating apparatus 102.

<Effects>

Having the electrode pressing member 8 and the auxiliary conductive film 18, similarly to the first embodiment, the active gas generating apparatus 102 of the second embodiment has effects that: the electric field strength in the area, where the active gas 7 passes through the active gas flow path, the gas relay passage 50, and the plurality of the gas ejection holes 54 to reach the processing space 63, can be intentionally weakened; and the insulation between the metal electrode 10 and the auxiliary conductive film 18 can be secured, with good stability, by a relatively simple configuration.

In the active gas generating apparatus 102, the auxiliary conductive film 18 is pressed from above by the electrode pressing member 8 fixed to the base flange 4B. Therefore, in the active gas generating apparatus 102, the high-voltage application electrode unit 1 and the ground potential electrode unit 2 can be fixed, with good stability, onto the base flange 4B by the electrode pressing member 8.

Additionally, the ground potential is applied to the base flange 4B, and hence the auxiliary conductive film 18 can be set, by a relatively simple configuration, to the ground potential in a state in which the insulation with the metal electrode 10 is secured, by setting the auxiliary conductive film 18 to the ground potential via the base flange 4B and the electrode pressing member 8.

Further, the metal electrode 20, which is the second metal electrode, can be relatively easily set to the ground potential via the base flange 4B. Also, the base flange 4B is made of metal and has conductivity, and hence no electric field leaks into the lower processing space 63.

Additionally, the base flange 4B can eject the active gas 7 from the plurality of the gas ejection holes 54 (the plurality of the base flange gas ejection holes) to the lower processing space 63 via the gas relay passage 50, and hence the presence of the base flange 4B does not interfere with the function of ejecting the active gas 7.

Furthermore, the plurality of the gas ejection holes 54 of the base flange 4B are radially separated and arranged in plan view, that is, are arranged in a shower plate shape, and hence the uniform active gas 7 can be ejected to the entire surface of an object to be processed, such as a wafer, in the processing space 63, the object being a target to which the active gas 7 is to be ejected.

<Others>

It is desirable that the raw material gas 5 to be used in the active gas generating apparatuses 101 and 102 of the above-described embodiments is a gas containing at least one of hydrogen, nitrogen, oxygen, fluorine, and chlorine gas.

A process for forming a nitride film, an oxide film, or the like, generation of an etching gas or a cleaning gas, and a surface modification process can be performed by using the above-described gas as the raw material gas.

Hereinafter, this point will be described in detail. If nitrogen or oxygen is used as the raw material gas 5, an insulating film such as a nitride film or an oxide film can be formed. If fluorine or chlorine gas is used as the raw material gas 5, an activated fluorine gas or chlorine gas can be used as an etching gas or a cleaning gas. If hydrogen or nitrogen is used as the raw material gas 5, the surface of a predetermined object such as a substrate can be hydrogenated or nitrided by an activated hydrogen gas or nitriding gas, so that a surface modification process can be performed.

In the above-described embodiments, the planar shapes of the electrode dielectric film 11, the metal electrode 20, the electrode dielectric film 21, and the base flanges 4, 4B are circular, but they may be formed in other planar shapes such as a rectangular shape.

Also, in the above-described embodiments, the planar shapes of the electrode pressing member 8 and the auxiliary conductive film 18 are annular, but they may be formed in other planar shapes such as a rectangular shape having an internal space.

Although the present invention has been described in detail, the above description is an example in all aspects, and the present invention is not limited thereto. It is to be understood that countless variations not illustrated can be conceived of without departing from the scope of the present invention.

The invention claimed is:

1. An active gas generating apparatus that generates an active gas obtained by activating a raw material gas supplied to a discharge space, the active gas generating apparatus comprising:

a first electrode component; and a second electrode component provided below said first electrode component, wherein:

said first electrode component has a first electrode dielectric film and a first metal electrode formed on an upper surface of said first electrode dielectric film, said second electrode component having a second electrode dielectric film and a second metal electrode formed on a lower surface of said second electrode dielectric film, an AC voltage being applied to said first metal electrode, said second metal electrode being set to a ground potential, and a dielectric space in which said first and second electrode dielectric films face each other including, as said discharge space, an area where said first and second metal electrodes overlap each other in plan view;

said first electrode dielectric film has, at its center, a gas supply port for supplying said raw material gas to said discharge space, said gas supply port being provided not to overlap said first metal electrode in plan view;

said second electrode dielectric film has at least one gas ejection hole for ejecting said active gas downward;

said first electrode component further has an auxiliary conductive film formed, independently of said first metal electrode, on said upper surface of said first electrode dielectric film;

said discharge space is formed to surround said gas supply port without overlapping said gas supply port in plan view;

said at least one gas ejection hole is arranged such that a distance from said gas supply port is larger than a distance from said discharge space without overlapping said gas supply port and said discharge space in plan view, and in said dielectric space, a path from said discharge space to said at least one gas ejection hole is defined as an active gas flow path;

said auxiliary conductive film surrounds said first metal electrode without overlapping said first metal electrode in plan view, and overlaps part of said active gas flow path in plan view;

said active gas generating apparatus further comprises
an electrode auxiliary member that is provided to contact part of an upper surface of said auxiliary conductive film and that has conductivity; and
said auxiliary conductive film is set to a ground potential via said electrode auxiliary member.

2. The active gas generating apparatus according to claim 1, wherein:
said second electrode dielectric film has a protruding area whose upper portion protrudes along an outer periphery in plan view; and
said first and second electrode dielectric films are laminated such that a lower surface of said first electrode dielectric film contacts an upper surface of said protruding area of said second electrode dielectric film, and a closed space shielded from an outside is formed, as said dielectric space, between said lower surface of said first electrode dielectric film and an upper surface of said second electrode dielectric film.

3. The active gas generating apparatus according to claim 1, further comprising
a base flange that is provided below said second electrode component, that supports said second electrode component by contacting said second metal electrode, and that has conductivity, wherein:
said base flange has at least one base flange gas ejection hole for ejecting downward an active gas ejected from said at least one gas ejection hole;
said electrode auxiliary member is fixed to said base flange in a state of being electrically connected to said base flange; and
a ground potential is applied to said base flange.

4. The active gas generating apparatus according to claim 3, wherein
said at least one base flange gas ejection hole provided in said base flange includes a plurality of base flange gas ejection holes, and said plurality of said base flange gas ejection holes are radially separated and arranged in plan view.

\* \* \* \* \*